United States Patent [19]

Moll

[11] Patent Number: 4,555,611
[45] Date of Patent: Nov. 26, 1985

[54] METHOD AND APPARATUS FOR UNIFORMLY HEATING ARTICLES IN A VACUUM CONTAINER

[75] Inventor: Eberhard Moll, Triesen, Liechtenstein

[73] Assignee: Balzers Aktiengesellschaft, Liechtenstein

[21] Appl. No.: 526,526

[22] Filed: Aug. 26, 1983

[30] Foreign Application Priority Data

Sep. 10, 1982 [CH] Switzerland ......................... 5389/82

[51] Int. Cl.⁴ .............................................. B23K 9/00
[52] U.S. Cl. .............................. 219/121; 219/121 PY; 219/121 PX
[58] Field of Search ................ 219/121 PY, 121 PV, 219/121 PA, 499, 121 PR, 123, 121 PL, 121 PX, 121 PG, 121 PD, 121 PE, 121 P; 427/42, 38, 248.1, 34; 118/723; 204/164

[56] References Cited

U.S. PATENT DOCUMENTS

| | | | |
|---|---|---|---|
| 3,614,510 | 10/1971 | Maskell | 219/121 PR |
| 3,944,412 | 3/1976 | Liu | 219/121 PR |
| 4,301,352 | 11/1981 | Shipai et al. | 219/121 PR |
| 4,448,802 | 5/1984 | Buhl et al. | 219/121 PA X |
| 4,471,003 | 9/1984 | Cann | 219/121 PL |

*Primary Examiner*—C. L. Albritton
*Assistant Examiner*—M. M. Lateef
*Attorney, Agent, or Firm*—McGlew and Tuttle

[57] ABSTRACT

To heat articles in the vacuum container as uniformly as possible by bombarding them with electrons from a low voltage arc discharge, the plasma flame is not directed at the articles as hitherto usual, but caused to extend past the articles to be heated, by providing a magnetic field in which the lines of magnetic force favoring the propagation of the plasma extend in a direction skirting the surfaces of the articles. Preferably, a magnetic field is provided which is parallel to the axis of the plasma flame, and the articles to be heated are arranged cylindrically around the flame.

7 Claims, 2 Drawing Figures

METHOD AND APPARATUS FOR UNIFORMLY HEATING ARTICLES IN A VACUUM CONTAINER

FIELD AND BACKGROUND OF THE INVENTION

This invention relates in general to vacuum treating devices and in particular to a new and useful method of heating articles in a vacuum using a plasma flame and a magnetic force which favors the generation of the plasma acting in a direction skirting the surfaces of the articles.

The present invention relates to a method of heating articles in a vacuum container. Such methods are applied for degassing, soldering, sintering, hardening and in connection with coating and ion-beam treatment, for example. The purpose is to obtain an as uniform as possible heating of the articles. In prior art vacuum heating furnaces, the articles to be heated are, for example, surrounded by heating surfaces wherefrom the heat is transmitted by radiation or heat conduction. Electrically conducting articles may also be heated by induced currents, and further known is the use of a glow discharge as the source of heat which, in the case of so-called anomalous discharges, covers the entire cathode surface uniformly, so that the articles connected as cathode can be uniformly heated.

It is also known to heat substances, such as metals to be melted, in a vacuum through electron bombardment. In such an instance, however, a particular geometric arrangement of the source of electrons must be provided to obtain the desired temperature distribution in the heated substance. Up to now, only correspondingly high costs made it possible to ensure a uniform heating. Usually, however, the electron bombardment is provided just to an opposite effect, namely for producing narrowly limited hot areas having temperatures which greatly differ from those of the surrounding areas, for which purpose the easily focusable electron beams are particularly suitable.

A special form of heating by electron bombardment is heating by means of a low voltage arc discharge; for purposes of the present specification, by low voltage arc discharge, a gas discharge is understood which is established between a hot cathode emitting electrons by thermionic emission, and an anode (in this connection, it is irrelevant whether the cathode is kept at the emission temperature by the gas discharge alone, or through additional heating). Mostly, an inert gas is introduced at a location close to the cathode, such as into the cavity of a hollow cathode or into a special hot cathode chamber which communicates with the vacuum container through an aperture. It is customary to concentrate the plasma issuing from the hollow cathode or the hot cathode chamber and entering through the aperture into the container, by means of a magnetic field. The electrons then move along narrow helical paths whose center lines correspond to a large extent to the lines of magnetic force of the field. Arrangements of this kind are known, for example, from U.S. Pat. Nos. 3,210,454 and 4,197,175. Both these patents describe heating of a melt connected as the anode, by means of a magnetically beamed low voltage arc discharge which is directed (aimed) at the melt. This orientation of the beam is obtained by causing the lines of magnetic force, and thus the helical paths of the electrons, to extend through the mentioned aperture and then through the melt. The low voltage arc is thus employed for producing locally limited hot areas having temperatures greatly differing from those of the ambience. To employ electron beam furnaces or arc furnaces for heating articles or substances uniformly over the entire extent of their surfaces appeared difficult, as already mentioned, since a satisfactory uniformity in the electric current distribution in the heated material could hardly be achieved.

SUMMARY OF THE INVENTION

The present invention is directed to a method of uniformly heating articles under vacuum, in which only the articles and at most the respective supporting structure, are heated, and which does not require any radiating heating bodies or inductive heating coils accommodated in the container.

Accordingly, it is an object of the invention to provide a method of uniformly heating articles or matter in a vacuum container by bombarding them with electrons from a magnetically beamed low voltage arc discharge which is sustained between an anode provided in the container and a hot cathode which is provided in a separate cathode chamber communicating with the container through a aperture. During the heating operation a magnetic field is maintained such that those lines of magnetic force which extends through the aperture between the cathode chamber and the container do not extend through the articles or the matter to be heated. The magnetic field is maintained such that the lines of magnetic force which extend through the aperture do not extend to the anode of the low voltage arc discharge. The articles of matter themselves are connected as an anode of the low voltage arc discharge. The magnetic field advantageously is maintained so as to extend parallel to the surfaces of the articles which are maintained on the support. The articles or matter to be heated are arranged to surround the plasma flame. They are advantageously moved during the heating process. In accordance with the invention, a device for carrying out the invention includes a holding structure accommodated within a container which is connected to a hot cathode chamber in which a hot cathode is provided and which communicates with the heating chamber through an aperture forming a passage for the plasma produced by a low voltage arc discharge. The arrangement also includes a device for producing a magnetic field in the heating chamber so disposed so that the lines of magnetic force which extend through the aperture do not extend through the articles or matter which is supported by the holding structure of the working chamber.

The respective lines of magnetic force thus extend past the articles to be heated. The fact that in the inventive method, the electrons must first laterally deviate from the plasma beamed by the magnetic field, to reach the surfaces to be heated, produces the effect that the electrons become distributed over a large surface of the articles to be heated, since they are very easily movable along the lines of magnetic force, but hard to move perpendicularly thereto. A substantially more uniform heating is thus obtained as compared with a magnetically concentrated plasma flame directed at the articles to be heated.

The invention has the further advantage that internal structures, such as heating bodies and induction coils, can be saved, which provides space for equipment which might be needed for other processing in the same container; the field coils for guiding the plasma may be provided outside the container.

A preferred embodiment of the inventive device is obtained, with a cylindrical container, by providing an aperture and a field coil in coaxial arrangement with the container. The articles to be heated may then be arranged around the plasma column extending in the axis of the container, and the axially extending field produces the effect that the electrons move easily in the axial direction while in the radial direction, i.e. toward the anode, they reach the articles to be heated only after a dispersion. This anisotropy in the ease of motion of the electrons produces a uniform current distribution in the axial direction, and thus a uniform heating of the articles positioned around the axis.

In this preferred embodiment of the device, in which the holding structure supporting the articles to be heated cylindrically surrounds the axis of the plasma flame in the heating chamber and a coaxial field coil is provided for setting up a magnetic field concentrating on the plasma, the lines of magnetic force produced by the coil and closed in themselves, as far as they extend through the aperture through which the cathode chamber and the heating chamber communicate, encircle the heated articles without extending therethrough.

Accordingly, it is an object of the invention to provide an improved method of heating articles in a vacuum container utilizing a plasma flame and a magnetic field.

A further object of the invention is to provide a device for heating articles in a vacuum container using a plasma flame and a magnetic field which is arranged so that it does not extend through the articles which are to be heated.

A further object of the invention is to provide a device for heating articles in a vacuum which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
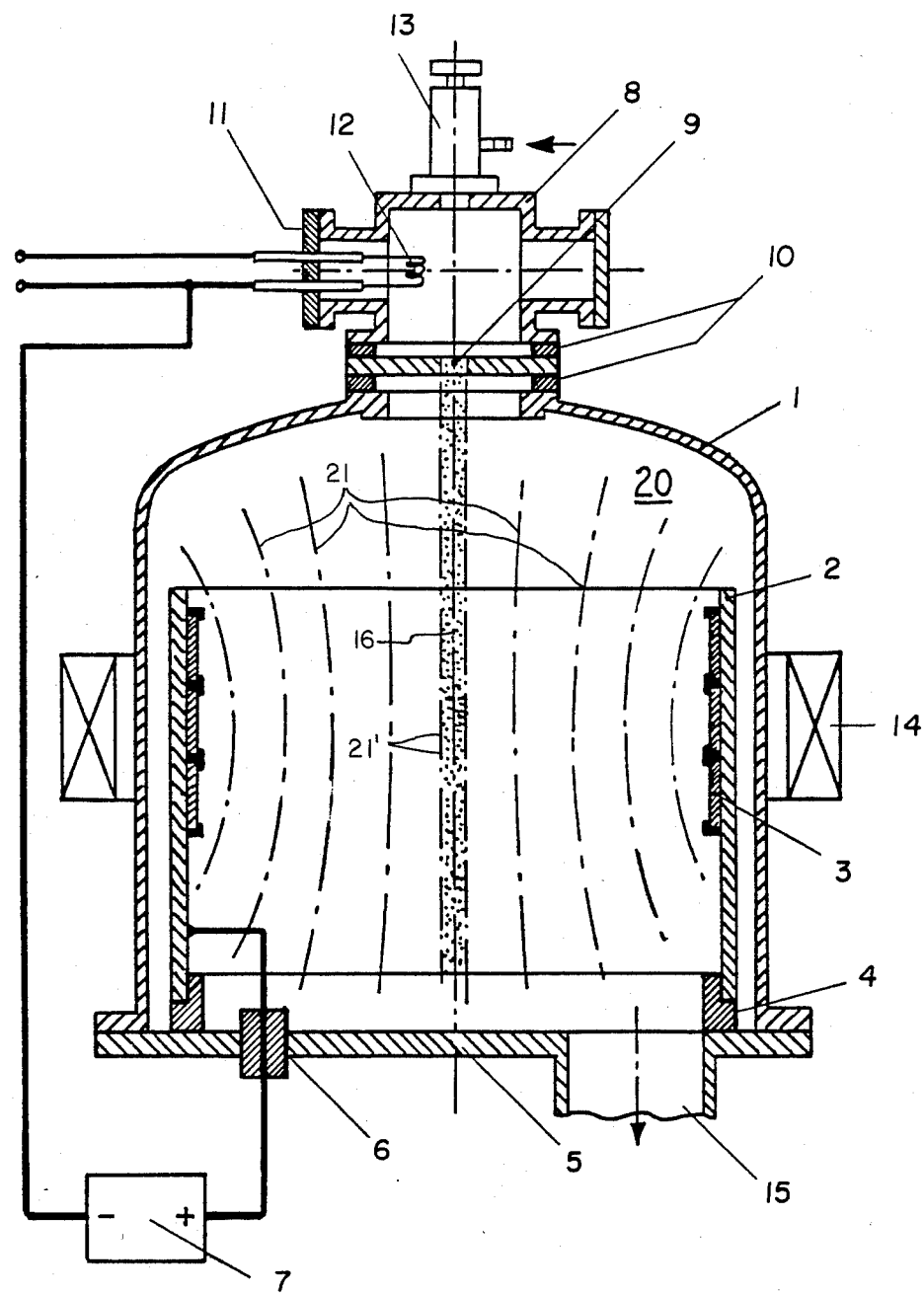
FIG. 1 is an axial sectional view of a preferred embodiment of the invention, where the plasma flame extends in the axis of a cylindrical container.

Referring to the drawings in particular, the invention embodied therein in FIG. 1 comprises a vacuum device including a container 1 connected to a hot cathode chamber 8 through an aperture 9.

FIG. 1 shows a bell-shaped vacuum container 1 in which the articles 3 to be heated are supported on a holding structure 2. The holding structure 2 is secured to a bottom plate 5 of the container by means of an electrically insulating ring 4 and is rigidly connected, through a vacuum-tight bushing 6, to the positive pole of a power supply unit 7. On the top of the container, a hot cathode chamber 8 is mounted which communicates through an aperture 9 with the inside 20 of the container 1. This inside forms a hot cathode chamber with a hot cathode 12 provided therein which, as shown in the figure, may be embodied by an electrically heated wire. However, the cathode may also take the shape of a heated or self-heating hollow cathode.

A control valve 13 is provided for supplying gases into hot cathode chamber 8. The field coil 14 produces in container 1 a coaxial magnetic field 21'. In the direction of the central line of magnetic force, starting from aperture 9, the intensity of the magnetic field increases until it reaches its maximum in the central plane of field coil 14. Farther below, the lines of magnetic force 21 diverge, however, the intensity of the field along the axis never drops below the value it has in aperture 9.

To perform the heating operation, container 1 and the hot cathode chamber 8 communicating with the inside 20 of the container are evacuated through connection 15 by means of a high-vacuum pump, until the pressure drops below about 0.01 Pa. With the pump still running, gas, for example the inert gas argon, is introduced through a valve 13 in an amount to obtain in the container an argon pressure between 0.1 Pa and 1 Pa. Then, hot cathode 12 is heated up and supply unit 7 is switched on. The supply unit produces a voltage of 100 volts, for example. (To ignite the low voltage arc, it is advisable to shortly apply the anode potential to the insulatd wall containing aperture 9, or to connect it permanently through an ohmic resistance to the plus pole of the supply unit 7, so that the ignition will be spontaneous). With a satisfactory strength of the field, (such as 0.01 Tesla), the electrons entering container 1 through aperture 9 follow the lines of magnetic force along helical paths of very small radii, so that a plasma column 16 is formed along the central axis, having a diameter depending on the diameter of the aperture 9. The magnetic field produces the effect that the electrons move easier parallel to the axis then perpendicularly thereto. Therefore, the stream of electrons is distributed over the entire holding structure 2 which is connected as anode. With an arc current of 100 A and an arc voltage of 50 V, a heating power of about 3 kW, for example, (efficiency 60%) may be transferred to holding structure 2 and articles 3. The volt-ampere characterstic of the discharge and the efficiency depend on the strength of the magnetic field and the argon pressure.

In the embodiment of FIG. 1, coil 14 produces the magnetic field which is substantially parallel to the vertical axis of the container, and it may be noted that the lines of magnetic force 21,21' extending lengthwise through the plasma column 16 near the axis do not intersect with the article to be heated. In the space between the plasma column 16 and the surfaces to be heated, the magnetic field is substantially parallel to the axis, and this produces the effect that the electrons are quite uniformly distributed in the axial direction before they reach the surfaces to be heated.

Figure 2:
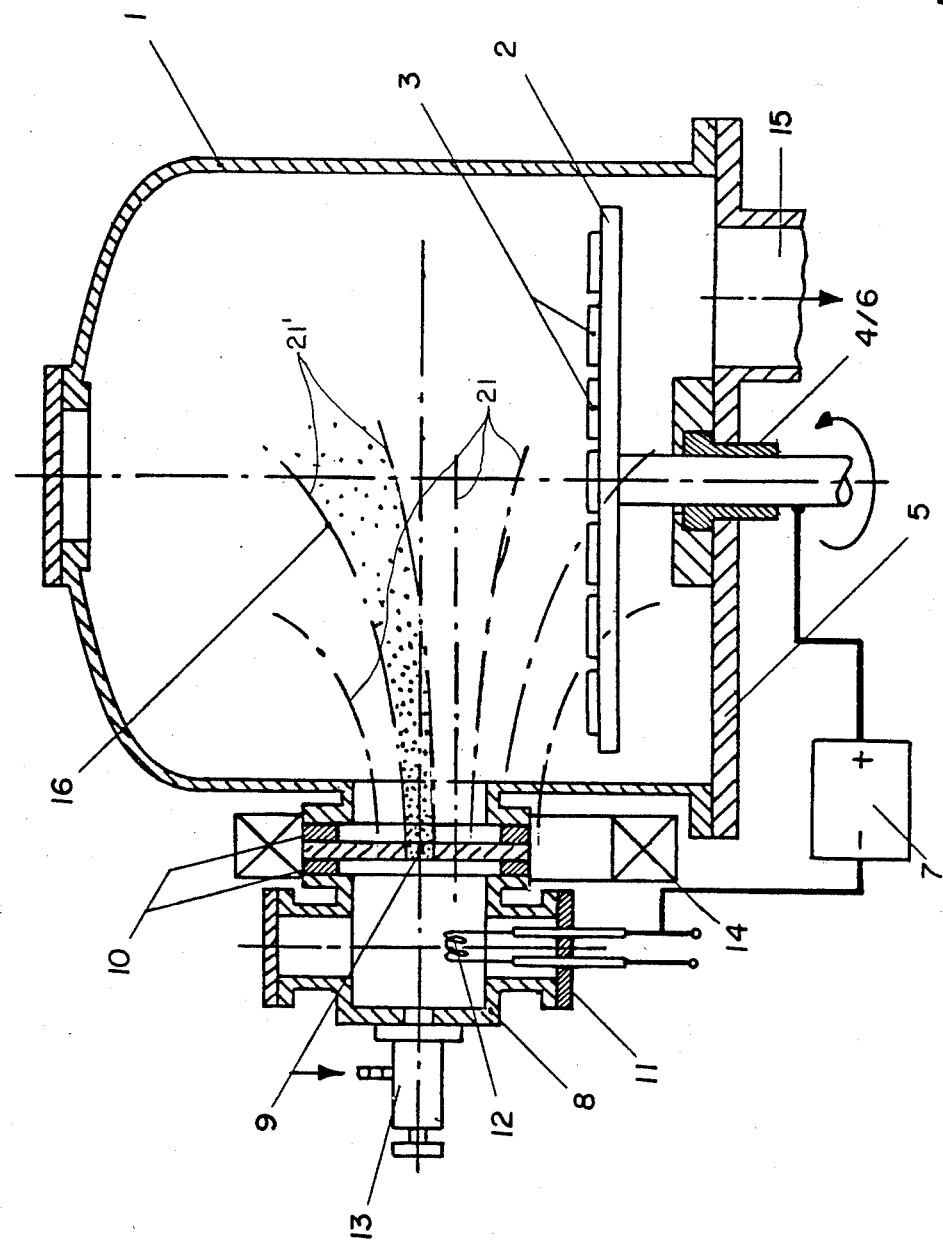
FIG. 2 shows another embodiment where the plasma flame extends substantially perpendicularly to the axis of the container.

In FIG. 2, parts having the same function as FIG. 1 are designated identically, thus shown are the recipient 1 and holding structure 2 for articles 3, which is supported on bottom plate 5 and electrically insulated therefrom by insulating members 4/6. Hot cathode chamber 8 is flanged to container 1 laterally, and is designed as according to FIG. 1. Again, a coil 14 is provided which, however, contrary to the arrangement of FIG. 1, is so disposed that the coil axis does not coincide with the longitudinal axis of the plasma flame 16 which extends during operation from the hot cathode chamber into the container but is spaced parallel therefrom by a certain distance. The effect thereof is that, as indicated in FIG. 2, plasma flame 16 gushing into container 1 through aperture 9 is deflected upwardly by the lines of magnetic force 21,21' above the axis of coil 14, and these lines 21', which extend through aperture 9, cannot intersect with the articles 3 to be heated. Other lines of magnetic force 21 which do not extend through aperture 9, but, for example, extend laterally thereof through the wall between cathode chamber 8 and container 1 may partly intersect with the surfaces to be heated, however, do not affect the plasma flame. In contradistinction thereto, in prior art arrangements, a magnetic field is just used for guiding the plasma confined by the lines of magnetic force toward the surfaces to be heated, which results in a locally very unequal heating, since the cross section of the plasma flame exhibits a very irregular density of charge carrier distribution. As compared to prior art plasma heating methods with a magnetical plasma flame control, the inventive method makes the heating substantially more uniform. With the device according to FIG. 1, for example, while heating a batch of tools (twist drills of steel) to an average temperature of 500° C., the temperature difference obtained between the hottest and the coolest spots of the charge was only 30° C., in spite of the arrangement of the heated tools in container 1 without any radiation shielding against the container walls held at room temperature. Such a uniformity of heating can be obtained with other methods only at substantially higher costs. Should it be desired in the inventive method to eliminate even the remaining small temperature differences, the articles to be heated may in addition be moved, for example by means of a turntable as shown in FIG. 2.

By "articles to be heated", not only objects but also material or matter, for example in the form of powder, are understood within the context of the specification.

A quite particular advantage of the inventive method is that the equipment needed therefor may frequently be employed also for other operations, such as for bombarding the articles to be heated with positive ions from the low voltage discharge. In such an instance, a negative potential relative to a (separate) anode is applied to the articles to be heated, so that gas escaped from the articles might result in spark discharges leaving damaging traces on the articles. Such gas escapes may be avoided by heating the articles in advance in a degassing phase. A bombardment with positive ions is provided, for example, in ion-plating or ionitriding processes.

While specific embodiments of the invention have been shown and described in detail to illustrate the application of the principles of the invention, it will be understood that the invention may be embodied otherwise without departing from such principles.

What is claimed is:

1. A method of uniformly heating articles in a vacuum container comprising: supporting the articles on an anode; bombarding the articles with electrons from a magnetically beamed low voltage arc discharge sustained between the anode, which is provided in the container, and a hot cathode which is provided in a cathode chamber communicating with the container through an aperture; and during the bombarding operation maintaining a magnetic field such that lines of magnetic force which extend through the aperture between the cathode chamber and the container do not extend through and do not intersect the articles to be heated.

2. A method according to claim 1, wherein said magnetic field is maintained such that those lines of magnetic force which extend through said aperture do not extend through the anode or the low voltage arc discharge.

3. A method according to claim 1 wherein the articles which are supported on the anode have a surface for bombardment with the electrons, the method including directing the magnetically beamed low voltage arc into the container in a direction parallel to the surface of the articles and at a location spaced from the articles, and maintaining the magnetic field so that its lines of magnetic force which extends through the aperture extend parallel to the surface of the articles.

4. A device for heating articles in a vacuum, comprising a container having an interior chamber, means defining a hot cathode chamber connected to said interior chamber, means for directing a plasma flame past the articles to be heated, a support for the articles to be heated positioned in the interior of said chamber and defining an anode, there being an aperture defined between said hot cathode chamber and the interior of said container means connected between said anode and said cathode for electrically energizing said anode and cathode to generate a low voltage arc discharge for bombarding the articles, and means for generating a magnetic field having lines of force favoring the generation of the plasma and extending through the aperture in a direction so as to intersect any surfaces of the articles.

5. A device according to claim 4, wherein said aperture is positioned so that the low voltage arc is discharged into said interior chamber in a direction parallel to the surface of the articles and spaced from the articles, said means for generating a magnetic field generating the magnetic field to have lines of force which extend through the aperture in a direction parallel to the surfaces of the articles and at a location spaced from the surfaces of the articles.

6. A device according to claim 4, wherein said hot cathode chamber extends through a side of said container.

7. A device according to claim 4, wherein said hot cathode chamber extends through the top of said container.

* * * * *